United States Patent [19]
Thomas et al.

[11] Patent Number: 6,124,818
[45] Date of Patent: Sep. 26, 2000

[54] PIPELINED SUCCESSIVE APPROXIMATION ANALOG-TO-DIGITAL CONVERTERS

[75] Inventors: David M. Thomas, Los Altos; Richard J. Reay, Mt. View, both of Calif.

[73] Assignee: Linear Technology Corporation, Milpitas, Calif.

[21] Appl. No.: 09/176,397

[22] Filed: Oct. 21, 1998

[51] Int. Cl.[7] .............................. H03M 1/12; H03M 1/38
[52] U.S. Cl. ........................................... 341/155; 341/161
[58] Field of Search ..................................... 341/155, 161

[56] References Cited

U.S. PATENT DOCUMENTS

| | | | |
|---|---|---|---|
| 5,274,377 | 12/1993 | Matsuura et al. | 341/161 |
| 5,764,176 | 6/1998 | Ginetti | 341/161 |
| 5,929,799 | 7/1999 | Rothenberg | 341/161 |
| 6,028,546 | 2/2000 | Signell et al. | 341/161 |

OTHER PUBLICATIONS

J. McCreary, P. Gary, "All–MOS Charge Redistribution Analog to Digital Conversion Techniques—Part 1," *IEEE J. of Solid–State Circuits*, vol. 10:371–379, Dec. 1975.

S. Sutarja, P. Gary, "A Pipelined 13–bit 250ks/s, 5V Analog to Digital Converter," *IEEE J. of Solid–State Circuit*, vol. 23:1316–1323, Dec. 1988.

S. Lewis, P. Gary, "A Pipelined 5–Msample/s 9–bit Analog to Digital Converter," *IEEE J. of Solid–State Circuits*, vol. 22:954–961, Dec. 1987.

T. Cho, P. Gary, "A 10b, 20Msamples/s, 35mW Pipeline A/D Converter," *IEEE J. of Solid–State Circuits*, vol. 30:166–172, Mar. 1995.

Kanti Bacranta, "A 12–bit Successive–Approximation–Type ADC with Digital Error Correction," *IEEE J. of Solid–State Circuits*, vol. 21:1016–1024, Jul. 1986.

*Primary Examiner*—Trong Phan
*Attorney, Agent, or Firm*—Fish & Neave; Robert W. Morris; Brajesh Mohan

[57] ABSTRACT

Improved pipelined successive approximation analog-to-digital converter circuits are provided. Some embodiments of the present invention comprises two stages in which a first portion of the total bits are evaluated in the first stage of the circuit and then the residue is passed to the second stage of the circuit that evaluates the remaining portion. By operating both stages simultaneously, the throughput is increased. These embodiments utilize two matched buffers to isolate the first and second stages from switching errors of a sampling circuit and the loading effects of comparators associated with the two stages. In another embodiment, upon completion of the conversion of the MSBs, the remaining input signal or residue signal is amplified by a preamp and the output is subsequently sampled by a residue sample and hold circuit (S/H). After the residue is sampled by the residue S/H, the second stage begins to solve the least significant bits (LSBs). The second stage is a matched copy of the first stage. Furthermore, if the CDACs and the preamps corresponding to the two stages are matched, the actual value of the preamp gain does not affect converter linearity. In yet another embodiment, a single preamp buffer is switched between the first and second stages. The preamp provides buffering of the top plates of the capacitor array from the residue sampling switch.

16 Claims, 14 Drawing Sheets

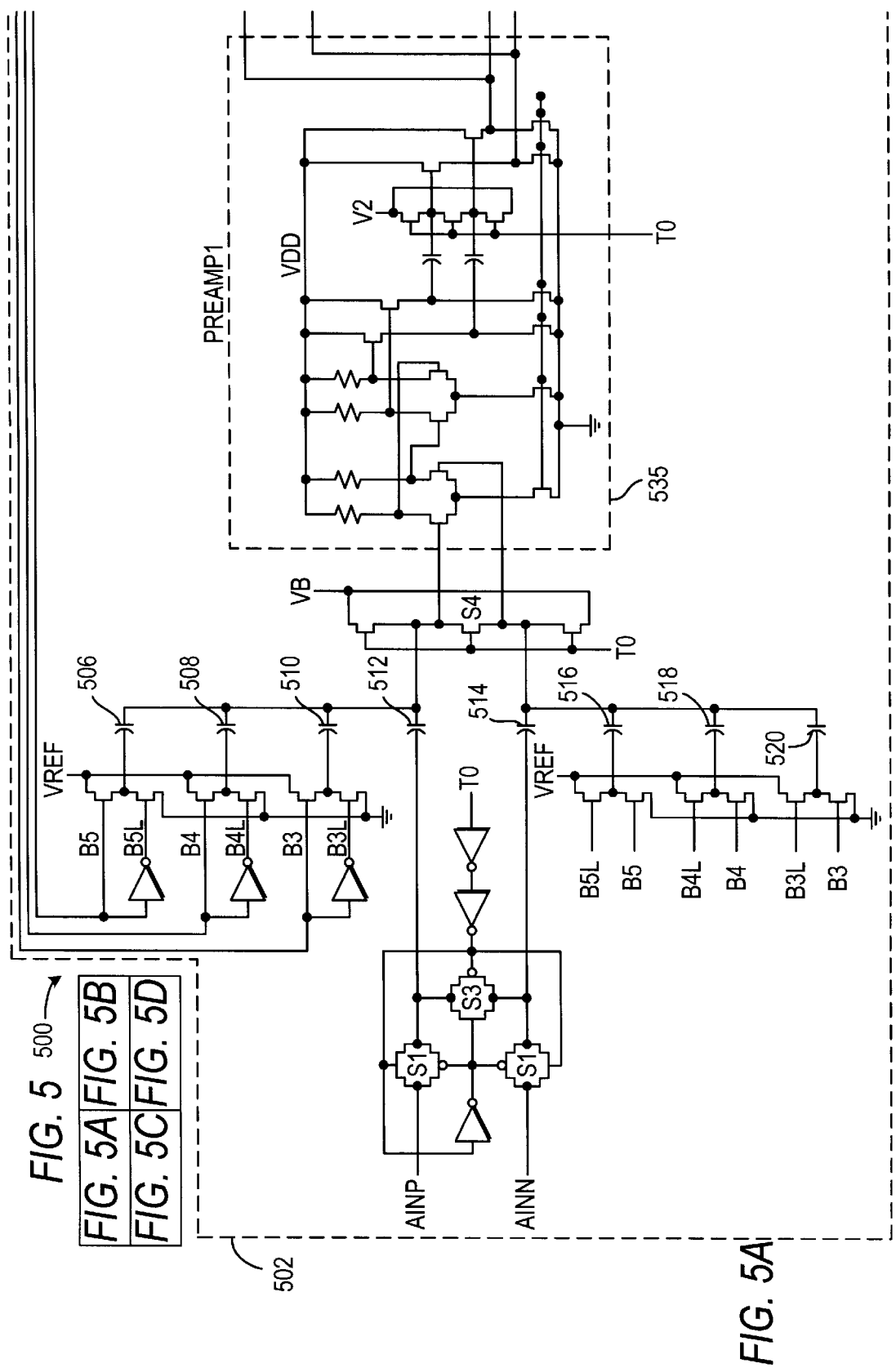

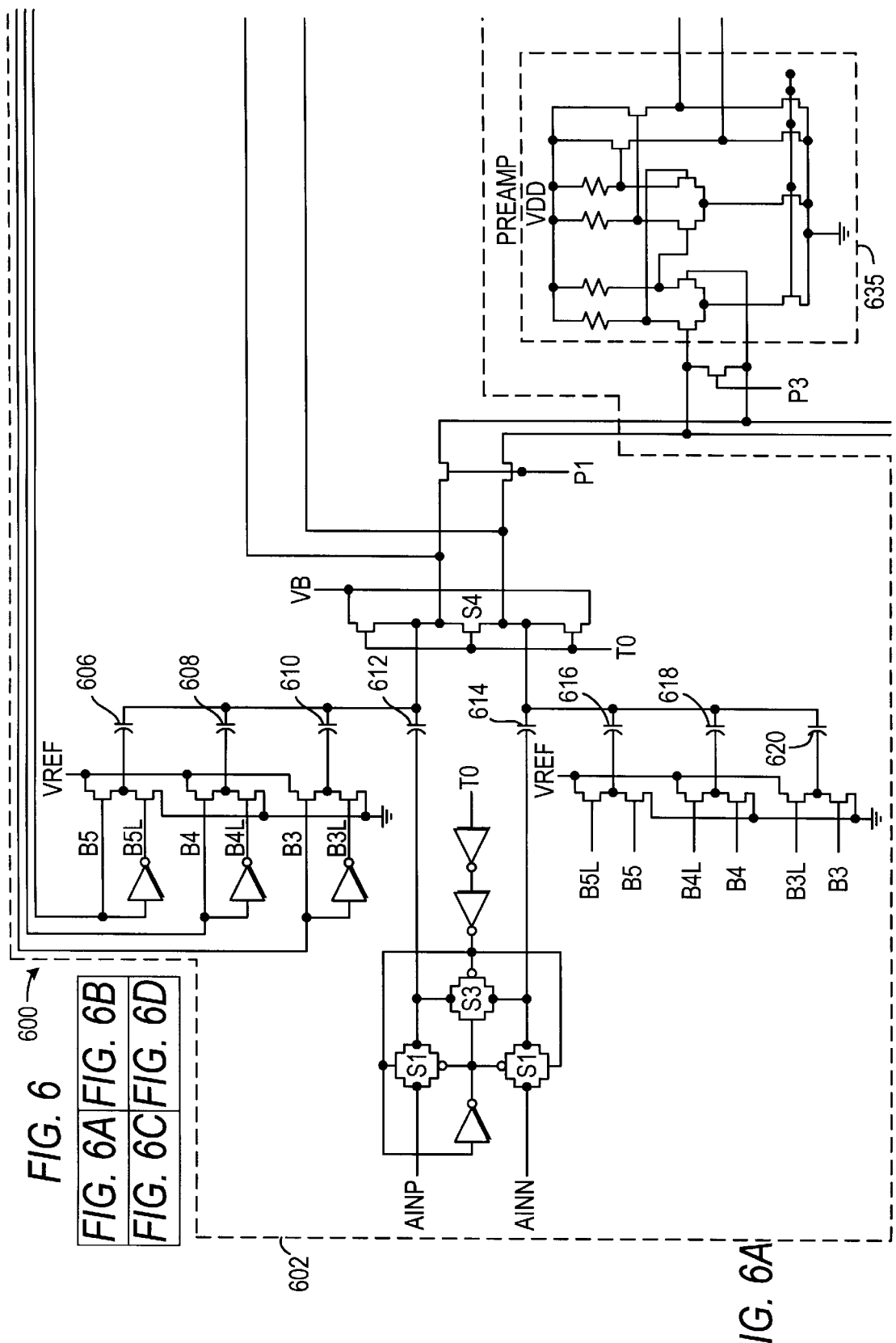

PIPELINED SUCCESSIVE APPROXIMATION ANALOG-TO-DIGITAL CONVERTERS

This invention relates to pipelined successive approximation analog-to-digital converters (ADCs). More particularly, the present invention relates to pipelined successive approximation ADCs in which the accuracy of the ADC is independent of devices used to isolate various stages or induce a gain between stages.

BACKGROUND OF THE INVENTION

A successive approximation ADC samples an analog input and compares it to the output of a digital-to-analog converter (DAC). Each bit in the digital input of the DAC is sequentially determined until the DAC output equals the sampled analog input. A capacitor digital-to-analog converter (CDAC) is the basic element in many ADC circuit designs because the CDAC can also perform a sample and hold on the input signal.

CDACs are commonly used, in particular, in successive approximation ADCs. Successive approximation ADCs systematically evaluate the analog input signal in N steps to produce an N-bit digital code. The analog signal is successively compared to the CDAC output to determine the digital code, beginning with the determination of the most significant bit (MSB) and progressing until the least significant bit (LSB) is determined. In each successive comparison, the analog signal is compared to the CDAC's output resulting from the previously approximated bits plus the bit currently being tested, where the current bit is kept at 1 only if the CDAC's output is less than the analog signal.

One of the disadvantages inherent to successive approximation ADCs is that each bit must be sequentially determined, which adversely increases the time required to perform the conversion, especially when compared to flash ADCs. This disparity exists because flash ADCs do not sequentially determine each bit, but rather simultaneously solve all of the bits. Although relatively small and low-power ADCs can be realized using successive approximation techniques, these ADCs tend to be relatively slow because they require many clock cycles to complete each analog-to-digital conversion. An increase in the rate of analog-to-digital conversion, however, can be achieved by reducing the number of clock cycles needed for each analog-to-digital conversion by using a multistage pipelined ADC.

Multistage pipelined architectures allow multiple stages to operate concurrently to provide a high throughput rate. A multistage pipelined ADC works by having a first stage solve the most significant m bits and pass the analog remainder to the following stage, which solves the remaining n-m bits. At any time, the first stage operates on the most recent sample, while the next stage operates on the residue from the previous samples, and so forth. A sample and hold circuit between the two stages allows the second stage to operate while the first stage begins solving the next input sample. Thus, in a two stage pipelined architecture, two input samples are converted at the same time, doubling the sampling rate without changing the total time required for a single conversion.

Moreover, the die area occupied by pipelined converters is small compared to the area occupied by flash converters because pipelined converters require fewer comparators than flash converters (and thus, less circuitry). In addition to the die area being small for pipelined converters, die area also is linearly related to the resolution of the conversion, because if the necessary accuracy can be achieved through calibration or trimming, the resolution of the pipelined converter can in turn be increased by adding stages to the end of the pipeline without increasing the number of clock phases required per conversion. In contrast, flash architecture requires an exponential, rather than a linear increase in area to increase resolution and may also require trimming or calibration for higher linearity (e.g., greater than 8 or 9 bit linearity).

Known techniques of implementing an n-bit two stage pipeline converter involve having a first stage solve the most significant m bits and passing the analog remainder to a second stage that solves the remaining n-m bits. A sample and hold amplifier between the two stages allows the second stage to operate while the first stage begins solving the next input sample. In this manner, two input samples are being converted at the same time, doubling the sampling rate without changing the total time required for a single conversion.

However, the pipelined successive approximation ADC described above typically suffers from poor integral non-linearity or often is slow due to a reference feedforward correction technique that sometimes is used. Furthermore, another significant disadvantage of the above described pipelined successive approximation ADC topology, and other existing pipeline topologies is the need for a precision gain amplifier between the stages. The precision gain amplifier is required because if an analog signal is passed to a subsequent stage with even a slight gain error, the ADC will exhibit linearity errors. Accordingly, an accurate gain stage requires a feedback amplifier with a very high open loop gain that is generally slower than other circuits in the ADC and limits the conversion rate.

SUMMARY OF THE INVENTION

In view of the foregoing, it is an object of the present invention to provide an improved pipelined successive approximation ADC circuit that is independent of devices used to isolate various stages or induce a gain between stages.

It is a further object of the present invention to provide an improved pipelined successive approximation ADC circuit that does not need a precision gain amplifier between stages and therefore does not suffer from poor integral non-linearity.

It is a further object of the present invention to provide an improved pipelined successive approximation ADC circuit which does not require precise gain and subsequently, does not use a referenced feedforward correction technique rendering it slow.

These, and other objects of the present invention, are accomplished by an improved pipelined successive approximation ADC circuit. An illustrative embodiment of the present invention comprises two stages. A first portion of the total bits are evaluated in the first stage of the circuit and then the residue is passed to the second stage of the circuit that evaluates the remaining portion. Thus, in a three-bit pipelined SAR, the first 3 bits are evaluated by the first stage of the circuit, and then the voltage at the input of the voltage comparator is passed to the second stage of the circuit, where it is further evaluated. Thus, by operating both the first stage and the second stage simultaneously, the throughput is increased.

Moreover, this embodiment of the invention utilizes two buffers to isolate the first stage and the second stage from switching errors of the sampling circuit and the loading effects of comparators associated with the two stages. The gain and linearity of the buffers is not critical to the accuracy of the ADC as long as both buffers match transfer functions, e.g., gain, linearity and offset, to the required accuracy of resolution of the second stage. The required resolution corresponds to the residue being passed. For example, for a 3-bit second SAR, the buffer would have to match within 1 part in $2^3$, i.e., 1 part in 8.

In another illustrative embodiment of the present invention, the first stage utilizes a conventional successive approximation register (SAR) to convert the most significant bits (MSBs). Upon completion of the conversion of the MSBs, the remaining input signal or residue signal is amplified by a preamp and the output is subsequently sampled by a residue sample and hold circuit (S/H). After the residue is sampled by the residue S/H, the second stage begins to solve the least significant bits (LSBs). At the same time that the second stage begins solving the LSBs, the first stage begins to solve the MSBs of the next input sample.

LSBs are solved until the output of the second stage amplifier through a second preamp equals the first stage residue signal held by the residue S/H. The second stage is a matched copy of the first stage. Furthermore, if the CDACs and the preamps corresponding to the two stages are matched, the actual value of the preamp gain does not affect converter linearity. Decoupling converter linearity from preamp gain allows flexibility in designing the preamp, resulting in the performance of the pipelined successive approximation ADC being independent of preamp gain. In fact, using the design described above, the need for a comparatively slow feedback amplifier and consequently feedback, is circumvented. The performance of the resulting pipelined successive approximation ADC is thus improved by using an open loop amplifier to boost the speed of the circuit in contrast to using a high gain feedback amplifier. Additionally, because of the above-described decoupling of the preamp gain and converter linearity, preamps with imprecise low gains can be utilized, increasing the conversion rate relative to other pipeline topologies that require accurate gain amplifiers.

In yet another illustrative embodiment of this invention, the ADC provides one preamp which is switched between the first and second stages. The provided preamp provides buffering of the top plates of the capacitor array from the residue sampling switch.

The above is accomplished by switching the inputs of the preamp between the first stage CDAC and the second stage CDAC. In order to compensate for the absence of buffers in the above described circuit, which may lead to charge stored on the inputs of the preamp from the previous conversion disrupting the new CDAC voltage about to be captured when the preamp is switched onto the first CDAC, the inputs of the preamp are reset to a known state before connecting the preamp to the first CDAC. Resetting the inputs of the preamp zeroes out any memory of a previous conversion. Because the same preamp is switched between stages, it is not necessary to match gains or transfer functions. Thus, in accordance with this embodiment of the invention, the pipelined successive approximation ADC can be constructed without being concerned about preamp matching.

BRIEF DESCRIPTION OF THE DRAWINGS

The above and other objects of the present invention will be apparent upon consideration of the following detailed description, taken in conjunction with the accompanying drawings, in which like reference characters refer to like parts throughout, and in which:

FIGS. 5A–5D, collectively referred to as FIG. 5, are simplified schematic diagrams of a differential six-bit pipelined successive approximation ADC in accordance with the principles of this invention; and FIGS. 6A–6D, collectively referred to as FIG. 6, are simplified schematic diagrams of another embodiment of a differential six-bit pipelined successive approximation ADC in accordance with this invention.

BACKGROUND

Figure 1A:
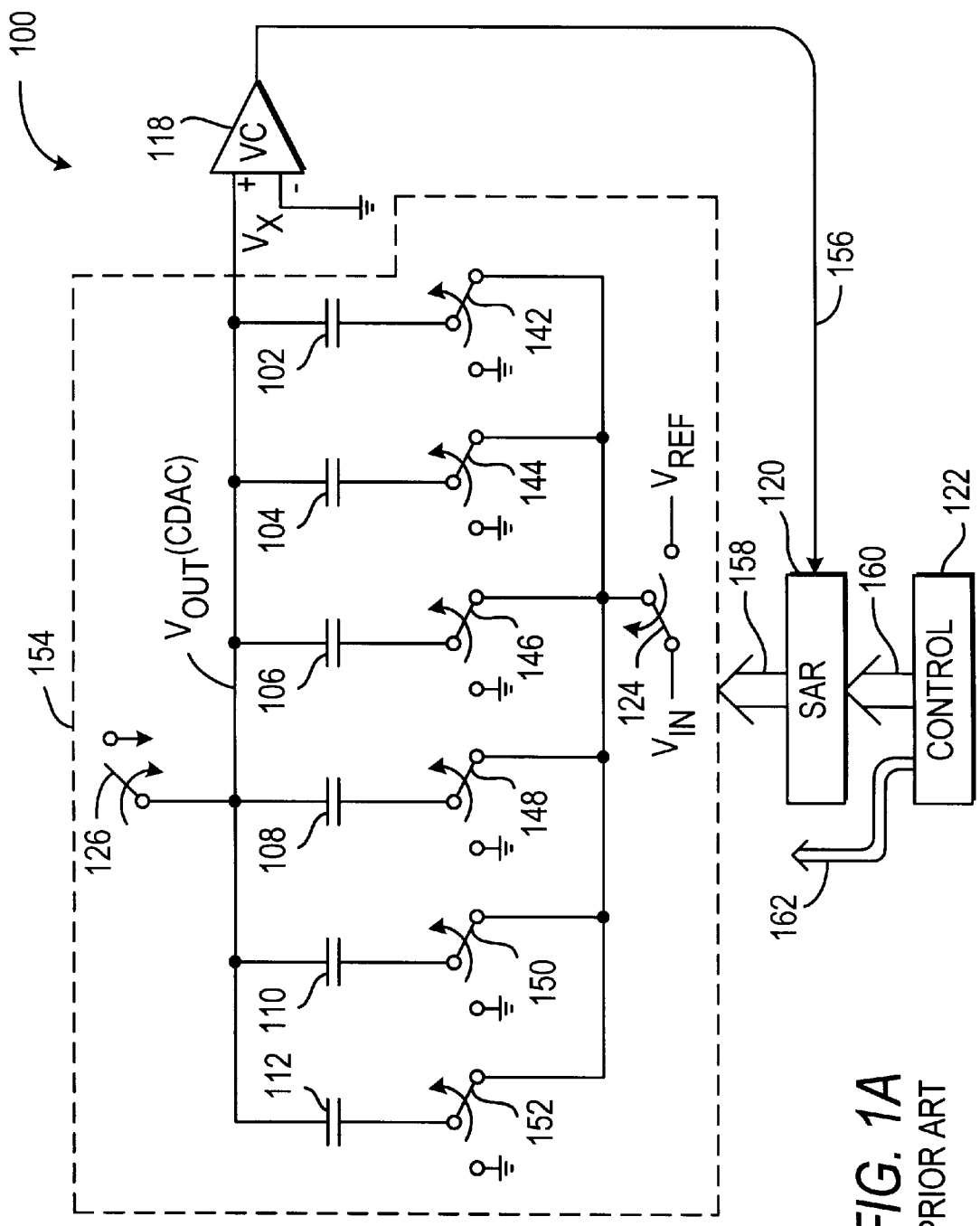
FIGS. 1A–1C, collectively referred to as FIG. 1, are schematic diagrams of a known CDAC-based single input 5-bit ADC with a single-ended successive approximation architecture.
Figure 1B:
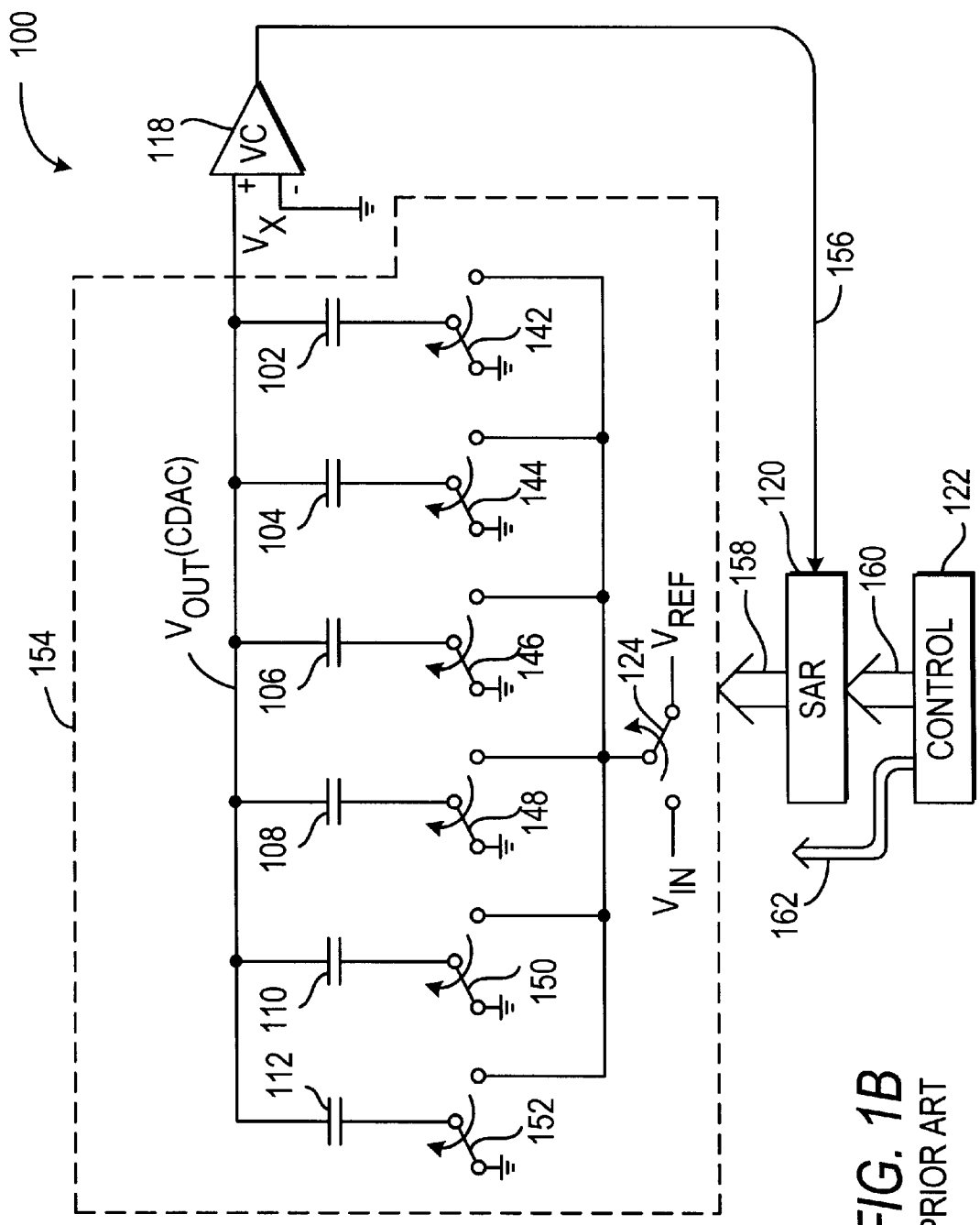
Figure 1C:
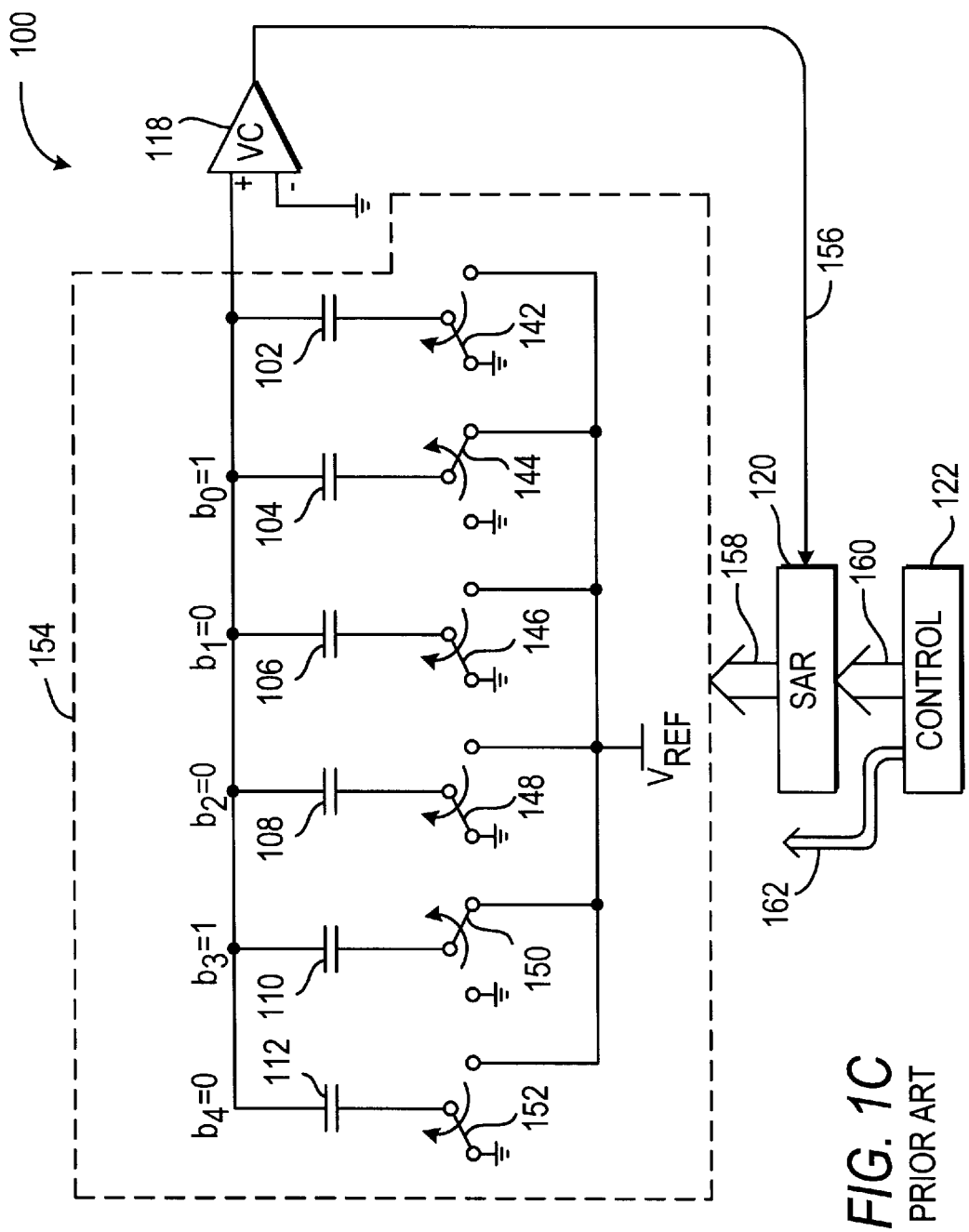

FIGS. 1A, 1B and 1C, collectively referred to as FIG. 1, show an example of a known CDAC-based single input 5-bit ADC with a single-ended successive approximation architecture. ADC 100 is constructed as described in "All-MOS Charge Redistribution Analog-to-Digital Conversion Techniques-Part 1, " J. McCreary and P. Gray, IEEE Journal of Solid-State Circuits, Vol. SC-10, No. 6, pp. 371–79, December 1975, that is hereby incorporated by reference in its entirety.

ADC 100 produces a 5-bit digital output and comprises CDAC 154 and voltage comparator 118 (VCOMP 118). VCOMP 118 produces a digital output that is a logic 1 when the voltage at the positive input is greater than the voltage at the negative input, and outputs a logic 0 when the voltage of the negative input is greater than the voltage at the positive input. The positive input of VCOMP 118 is coupled to Vout (of CDAC 154) and the negative input is coupled to ground. ADC 100 also comprises successive approximation register (SAR) 120, coupled to the output of VCOMP 118 (via line 156), and control circuit 122.

Control circuit 122 produces a sequence of control signals that performs the successive approximation algorithm. These control signals control at least SAR 120 and sampling switches 124, 142 and 126 (via lines 160 and 162). SAR 120 produces a 5 bit output that controls switches 144–152 (via line 158). The 5-bit output of SAR 120 comprises bits $b_0$–$b_4$, which go from bit $b_4$, the most significant bit (MSB) that controls switch 152, to bit $b_0$, the least significant bit (LSB) that controls switch 144.

FIG. 1A illustrates ADC 100 in sampling mode whereby Vout (CDAC) is clamped to ground by switch 126 and the bottom plates (BPs) of all capacitor array 102–112 follow Vin. In FIG. 1B, the ADC is in hold mode because Vout (CDAC) is no longer clamped to ground and the input signal has been switched off. The above-described operation results in a stored charge on the top plate which is proportional to the input voltage $V_{in}$.

FIG. 1B shows the initial bit pattern applied during hold mode which corresponds to all of the BPs of capacitor array 102–112 being grounded. Because the charge on the top plate is conserved, its potential goes to $-V_{in}$.

FIG. 1C shows an example of one final setting of switches 152 to 144 which, in this instance, corresponds to the binary number 01001 (i.e., the grounded capacitors correspond to zero and the capacitors coupled to Vref correspond to one).

Some disadvantages associated with the above-described topology are described in commonly-assigned U.S. Pat. No. 5,581,252 ("Thomas"), that is hereby incorporated by reference in its entirety. For example, an error charge may be injected into the circuit at Vout (CDAC) when switch 126 opens. Typically, switch 126 is implemented with a MOS transistor. While this transistor is conducting, its channel contains a certain amount of charge. Some of this channel charge may be injected into the capacitors coupled to Vout (CDAC) when switch 126 opens. This error charge produces an offset error in voltage measured.

Also, a prohibitively large ratio between capacitors from MSB to LSB is required for a high resolution CDAC. For example, a 12 bit CDAC would require a MSB to LSB capacitor ratio of 2048. Large ratios are difficult to manufacture and can consume large amounts of die area. In addition, as described earlier, because each bit must be sequentially determined, the conversion rate is reduced in comparison to flash ADCs, which simultaneously solve all of the bits.

Figure 2:
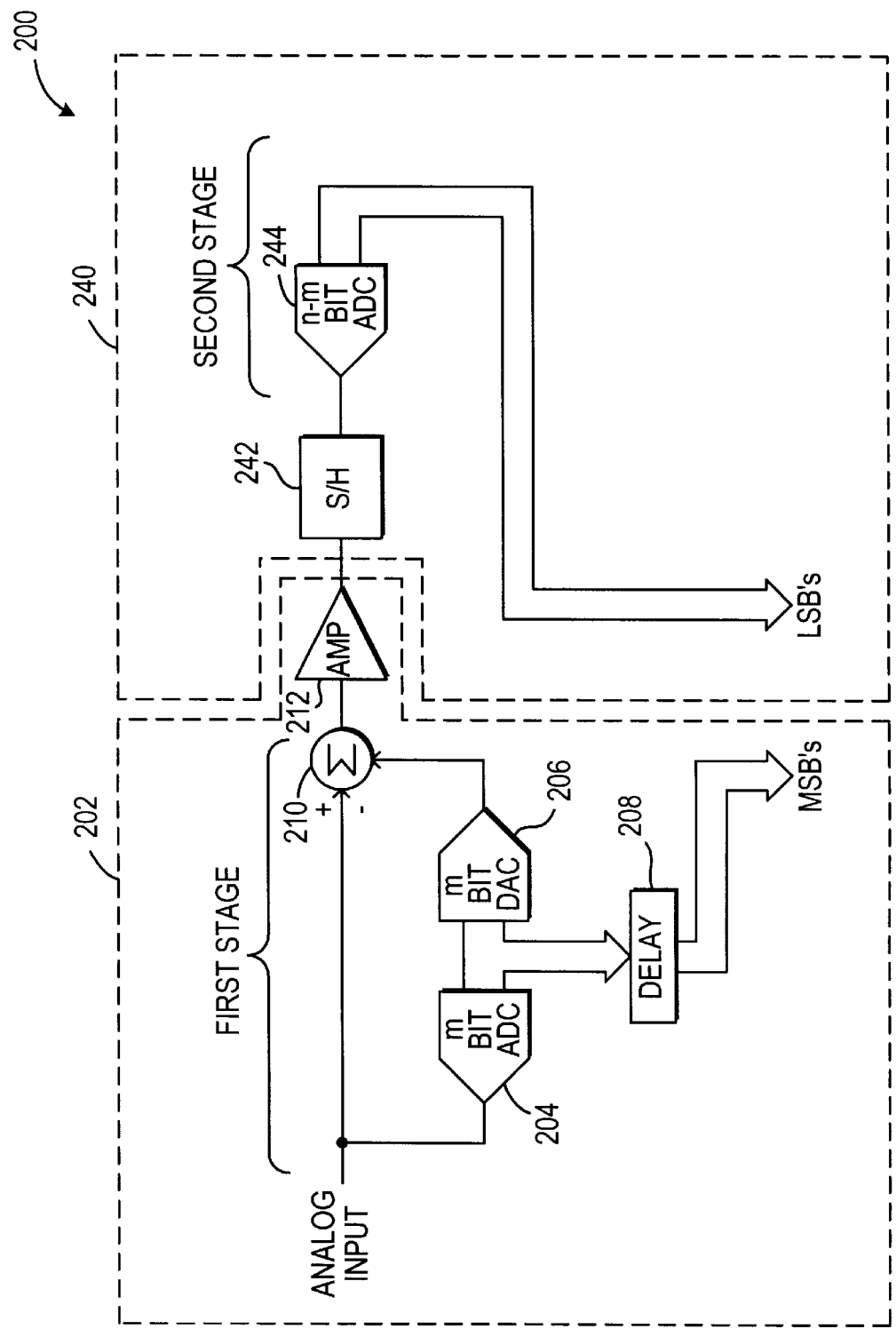
FIG. 2 is a block diagram of a known n-bit two stage pipeline successive approximation ADC.

FIG. 2 shows a block diagram of a known n-bit two stage pipeline converter 200. Pipeline converter 200 is constructed in accordance with the description in "A pipelined 5-Msample/s 9-bit Analog-to-Digital Converter," S. Lewis and P. Gray, IEEE Journal of Solid-State Circuits, Vol. SC-22, No. 6, pp. 954–961, December 1987, that is hereby incorporated by reference in its entirety. A similar converter is also described in "A 10 b, 20 Msample/s, 35 mW Pipeline A/D Converter," T. Cho and P. Gray, IEEE Journal of Solid-State Circuits, Vol. 30, No. 3, pp. 166–172, March 1995, that also is hereby incorporated by reference in its entirety.

Pipelined ADC 200 comprises of first stage 202 for evaluating the most significant m bits and second stage 240 for evaluating part or all of the remaining n-m bits. First stage 202 of ADC 200 initially performs a low-resolution A/D conversion on the held input. After first stage 202 has solved the most significant m bits, it passes the analog remainder (or residue) to second stage 240, which solves the remaining n-m bits.

First stage 202 comprises of low resolution ADC 204 that quantizes the analog signal. Low resolution DAC 206 converts the resulting low-resolution digital output back into its analog representation. The output of DAC 206 is subtracted from the analog input at 210 to produce a residue that is amplified by analog interstage amplifier 212 and sent to second stage 240. Meanwhile, first stage 202 outputs the MSBs after a delay that is induced by delay circuit 208.

Second stage 240 comprises sample and hold circuit 242 for sampling and holding the amplified analog output from first stage 202, thereby allowing all stages to operate concurrently. Second stage also comprises ADC circuit 244 for quantizing the residue analog signal. At any time, the first stage operates on the most recent sample, while the next stage operates on the residue from the previous sample, and so forth. The residue from first stage 202 that is amplified and held by sample and hold circuit 242 comprises the least significant n-m bits that are converted into the LSBs by ADC 244.

Other known topologies of pipelined successive approximation utilize a reference-feedforward correction technique to reduce mismatch between stages and interstage gain errors. One such topology is described in "A pipelined 13-bit, 250-ks/s, 5-V Analog-to-Digital Converter," S. Sutarja and P. Gray, IEEE Journal of Solid-State Circuits, Vol. SC-23, No. 6, pp. 1316–23, December 1988, that is hereby incorporated by reference in its entirety.

Under ideal conditions, as the input increases from 0, the amplified residue increases from 0 as well, but with a gain (as determined by the amplifier) relative to the input. Under these conditions, the peak values of the amplified residue are exactly equal to the reference. However, under non-ideal conditions, as is typically the case, peak values of the amplified residue no longer equal the reference voltage. These non-uniformities in the amplified residue produce errors in the overall converter transfer characteristics.

Reference-feedforward correction involves modifying the reference of the subsequent stages so that it always equals the possible peak value of the amplified residue. When the peak values of the amplified residue are less than the reference, the digital output codes corresponding to residues in the range between the peak amplified residue and the reference are never produced. Reference-feedforward correction is also used to reduce vertical and horizontal jumps in the overall converter transfer characteristics owing to the interstage gain being too low or too high.

However, even after using the reference-feedforward correction technique, the transfer characteristics still suffer from non-linearities due to the digital-to-analog converter used in the first stage of pipelined analog-to-digital converter. Because of this inherent limitation, reference-feedforward correction is primarily suited for applications that do not require a high degree of integral linearity or requirements of high speed.

Furthermore, such ADCs require a precision gain amplifier between stages in order to reduce linearity errors. An accurate gain stage requires a feedback amplifier with a very high open loop gain, which is generally slower than other circuits in the ADC and thus limits the conversion rate.

DETAILED DESCRIPTION OF THE INVENTION

The present invention comprises improved pipelined successive approximation analog-to-digital converters (ADCs) in which the accuracy of the pipelined successive approximation ADC is independent of devices used to isolate various stages or induce a gain between stages.

Figure 3:
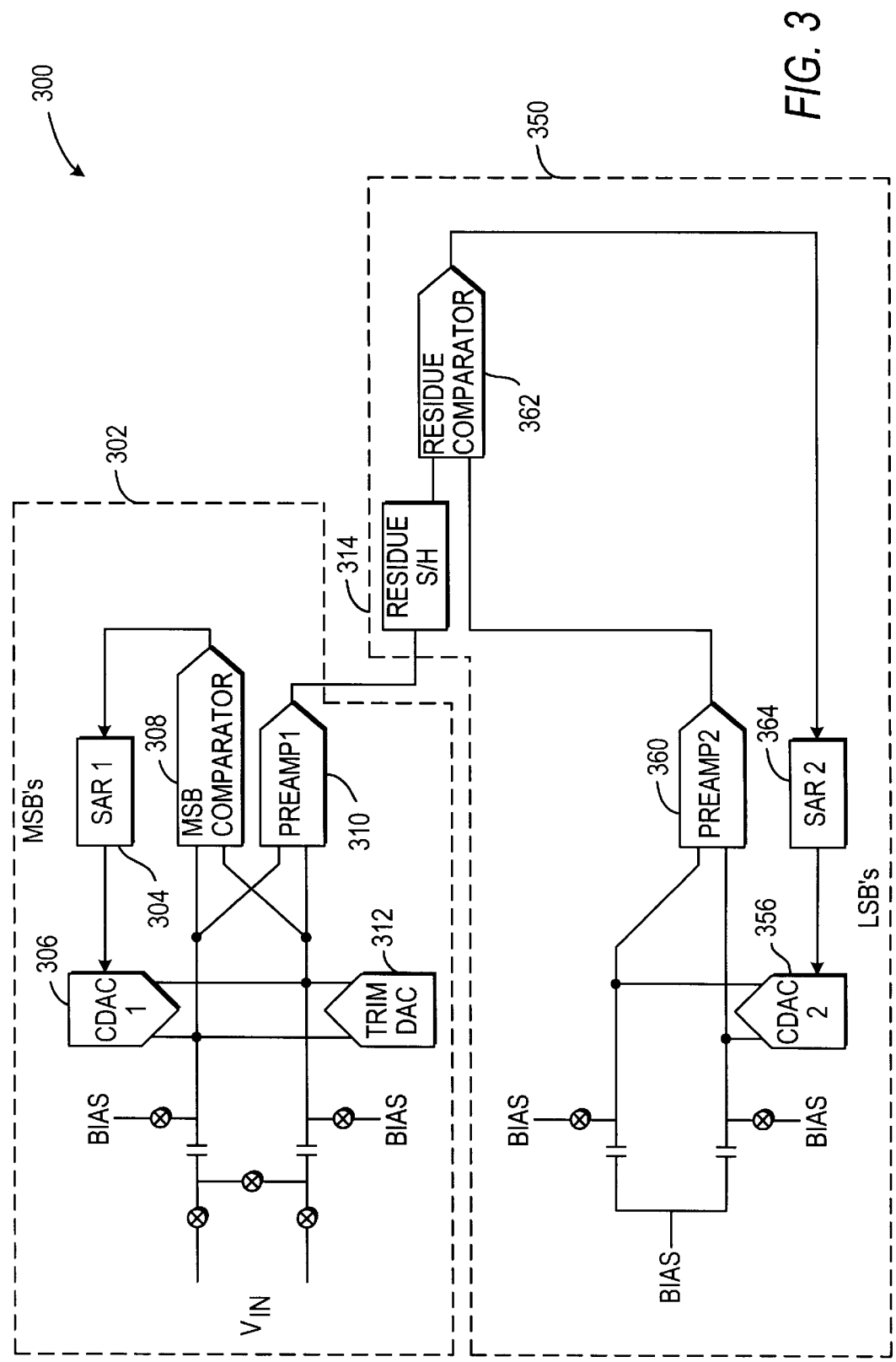
FIG. 3 is a block diagram of a n-bit two stage pipeline successive approximation ADC in accordance with this invention.

FIG. 3 is a block diagram that shows a pipelined successive approximation ADC 300 in accordance with the principles of the present invention. ADC 300 includes first stage 302 and second stage 350. First stage 302 comprises successive approximation register (SAR1) 304, CDAC1 306, trimmable DAC 312, MSB comparator 308, preamp1 310 and control circuit (not shown). Second stage 350 comprises CDAC2 356 (which is a matched copy of CDAC1 306), successive approximation register (SAR2) 364, residue comparator 362, preamp2 360 and residue sample and hold circuit 314. Trim CDAC 312 corrects for linearity errors caused due to mismatch between capacitors. Any charge injection offset that may have been introduced is reduced by the common mode rejection of MSB comparator 308.

After determining the most significant bits (MSBs), the residue signal is amplified by preamp1 310 and subsequently sampled by residue sample and hold circuit 314. After the residue is sampled, second stage 350 begins solving the least significant bits (LSBs), while first stage 302 begins solving the MSBs of the next input sample.

CDAC2 356 of second stage 350 is a matched copy of CDAC1 306 of first stage 302. Though a trim CDAC corresponding to trim CDAC 312 may be used to reduces offset errors or correct for linearity errors caused due to mismatch between capacitors, a trim CDAC is not necessary in second stage 350 because errors in the LSBs are smaller in proportion to the errors in the MSBs and as a result are not as critical to the performance of ADC 300. Second stage 350 solves the LSBs until its output equals the residue held on residue sample and hold 314 from first stage 302 as determined by the output of residue comparator 362. SAR 364 outputs the LSBs.

As discussed earlier, known pipeline topologies need a precision gain amplifier between stages to prevent the analog signal, as it passes to a subsequent stage, from acquiring even a slight gain error associated with the amplifier. This measure is found necessary to prevent the ADC from exhibiting linearity errors. A significant disadvantage associated with having an accurate gain stage is the requirement of a feedback amplifier with a very high open loop gain. A feedback amplifier with a very high open loop gain is slower than other circuits in the ADC and therefore limits the conversion rate.

In the embodiment shown in FIG. 3, CDAC1 306 and CDAC2 356, and preamp1 310 and preamp2 360 are matched. Because the preamps are matched, the actual value of the preamp's gain does not affect converter linearity. This allows flexibility in designing the preamps, that may have a low gain or a high gain. Thus, an accurate gain stage requiring a feedback amplifier with a very high open loop gain is not required according to this invention, and an open loop amplifier can be used instead.

Consequently, the above-described feature of applicants' invention allows having very fast preamps (because no feedback is required) in order to increase the conversion rate in comparison to the known art that uses accurate gain amplifiers with a very high open loop gain (and associated feedback) which limits the conversion rate. Moreover, this invention does not require the time-consuming reference feedforward correction since precise gain is not required. TrimDAC 312 corrects for capacitor mismatches in CDAC1 306, giving much better linearity performance than reference feedforward correction.

Figure 4:
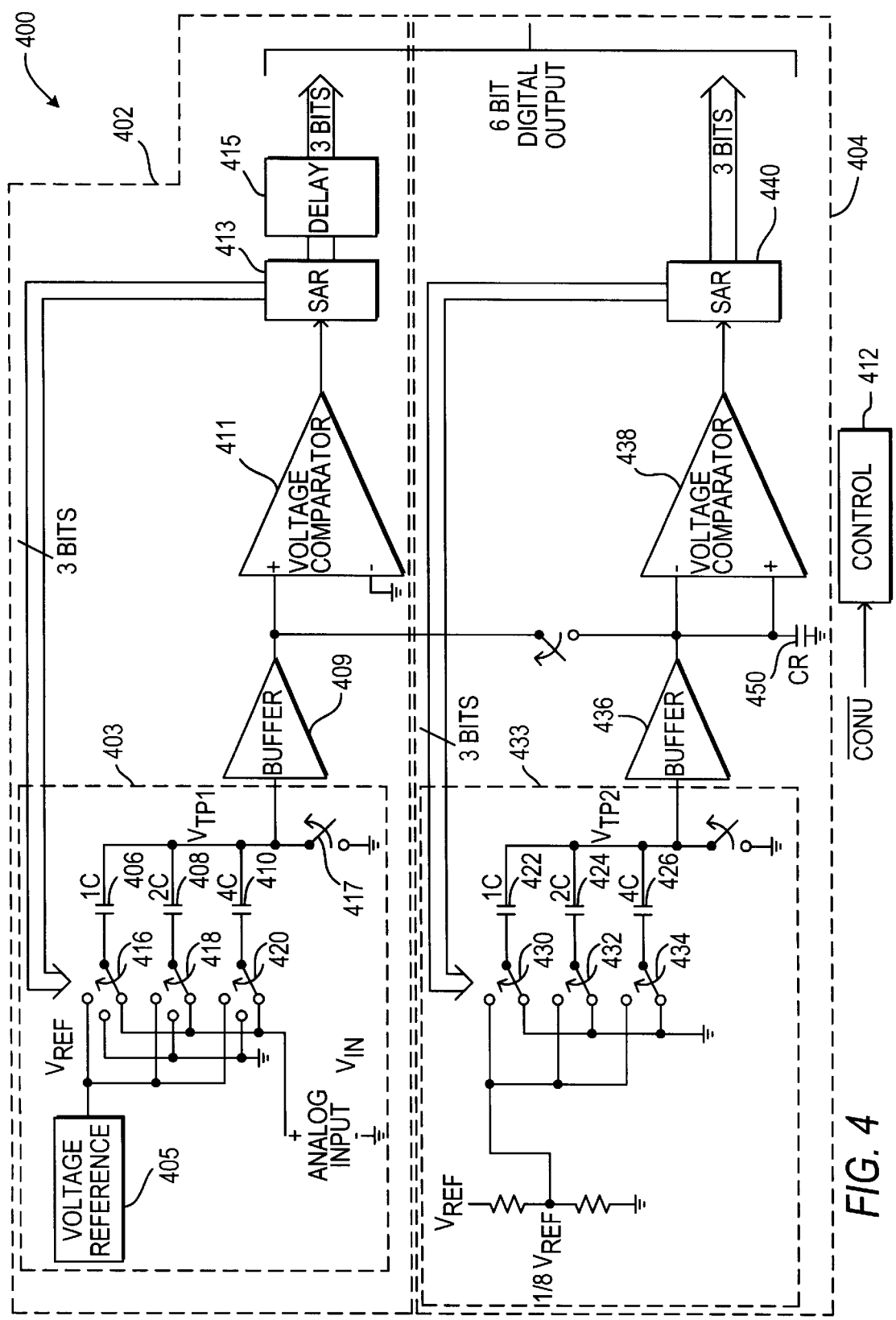
FIG. 4 is a simplified schematic diagram of a six-bit pipelined successive approximation ADC in accordance with the principles of this invention.

FIG. 4 is a simplified schematic diagram of a six-bit pipelined successive approximation ADC in accordance with the principles of this invention. In order to increase the throughput, in ADC 400 the first three bits are analyzed in first SAR section 402 and then the residue is passed to second SAR section 404. First SAR section 402 comprises CDAC 403, buffer 409, voltage comparator 411, SAR 413 and delay 415.

The input signal ($V_{in}$) to be evaluated is sampled by capacitor array 406–410 of CDAC 403 during the sampling period. During the sampling period, three-position DAC switches 416–420 are in the input sample position causing input signal $V_{in}$ to be coupled to capacitor array 406, 408 and 410 of CADC 403. Meanwhile, hold switch 417 couples the top plate of the capacitors comprising capacitor array 406–410 to ground GND2. At the end of the sampling period, hold switch 417 opens causing the input signal $V_{in}$ to be held by capacitor array 406, 408 and 410. Subsequently, three-position DAC switches 416, 418 and 420 are switched to ground (GND1).

As described in FIG. 1, input signal $V_{in}$ is evaluated by balancing the sampled input voltage $V_{in}$ against the proper portion of voltage reference $V_{ref}$ 405. The proper portion of voltage reference $V_{ref}$ 405 is found by sequentially testing each of the binary weighted capacitors to see if they are needed.

The residue is passed from first section 402 to second section 404 by sampling the first top plate voltage $V_{TP1}$, after the first three bits have been processed, onto capacitor 450 that shifts the threshold of second stage voltage comparator 438. Second section 404 then evaluates the residue by driving second top plate voltage $V_{TP2}$ from zero to the shifted second comparator threshold voltage, which is the residue passed from first section 402. When the second three bits (i.e., the LSBs) have been calculated, second top plate voltage $V_{TP2}$ will be nearly equal to top plate voltage $V_{TP1}$ of first SAR section 402 at the end of the first three bit evaluation.

Buffers 409 and 436 are used to isolate CDAC 403 and CDAC 433 from second stage 404 from switching errors of the sampling circuit and loading effects of respective comparators 411 and 438. These buffers could, for example, comprise source-follower transistors. The gain and linearity of buffers 409 and 436 is not critical to the accuracy of ADC 400 as long as both buffers 409 and 436 match transfer functions, e.g., gain, linearity and offset, to the required accuracy of resolution of second stage 404. For example, for a 3-bit second SAR, the buffer would have to match within 1 part in $2^3$, i.e., 1 part in 8.

FIG. 5 is a simplified schematic diagram of a differential six-bit pipelined successive approximation ADC in accordance with the principles of this invention.

It is well known that noise in a CMOS sample and hold circuit is the square root of kT/C, where K is Boltzmann constant (4.16e–21), T is temperature in Kelvin and C is capacitance. It is thus desirable to have gain between the DAC output and the sample and hold circuit, because increasing the signal voltage increases the tolerance for noise in the residue sampling capacitor. The preceding allows for a smaller capacitor to be used in the sample and hold circuit resulting in a faster circuit.

In accordance with the above, shown in FIG. 5 is a schematic diagram of a differential six-bit pipelined successive approximation ADC in accordance with the principles of this invention using preamps to provide the desired gain between the DAC output and the sample and hold circuit. As described above, it is desirable to have gain between the DAC output and the sample and hold circuit to increase the tolerance for noise in the residue sampling capacitor, allowing for a smaller capacitor to be used in the sample and hold circuit resulting in a faster circuit. Furthermore, the two preamps serve as buffers to the residue sample and hold switches, preventing switching noise from contaminating the held signal on the CDAC.

ADC 500 samples a positive and negative input signal onto a respective, positive and negative CDAC. Therefore, each bit in ADC 500 has an associated positive and negative capacitor that is driven by a digital signal and its compliment. ADC 500 comprises first differential CDAC 502, second differential CDAC 504 and control block 570 that generates timing signals T0–T3 for controlling various operations of ADC 500.

The input signal ($V_{in}$) and its compliment ($-V_{in}$) are evaluated by positive and negative capacitor arrays comprising capacitors 506–520. During the first time period T0, also called the sampling period, analog input signal $V_{in}$ is sampled onto the first differential capacitor array comprising capacitors 506–520. As described above, control block 570 generates timing signals T0–T3 for controlling various operations of ADC 500.

In the same period, i.e., T0, two transmission gates S1 and S2 connect the differential input signal to the differential sampling capacitors. Transmission gate S4 connects the top plates of capacitor array comprising capacitors 506–520 together to an appropriate bias voltage. The value of this bias voltage is of no significance to the performance of the respective capacitor arrays, but rather is for the purpose of the preamp or buffer that follows.

At the end of sampling period T0, transmission gate S4 is opened and the input signal is held. Shortly after S4 opens, input transmission gates S1 and S2 are opened and the bottom plates of sampling capacitors 506–520 are coupled together, transferring the sampled input charge onto the rest of the CDAC array.

Sampling period T1 initiates the test for the most significant bit (B5) by coupling capacitor 506, corresponding to the MSB, to reference voltage $V_{ref}$. As with the SARs described before in this application, comparator 525 determines whether the tested bit is required to balance the input signal. Similarly, sampling periods T2 and T3 initiate the tests for the next two MSBs, i.e., B4 and B3, respectively.

During the B3 test, residue sample and hold capacitors 533 and 534 are coupled to the output of preampl 535. When residue comparator 536 is used to compare the residue signal for the second part of the conversion, with residue sample and hold circuit 538 in front of it, the threshold of residue comparator 536 is shifted. This shift in threshold is equal to the multiple of the residue of first stage 502 at the completion of sampling period T3 and the gain of preamp1 535.

Second stage 504 drives the top plate of capacitor array comprising capacitors 522–529 from ground to the sampled residue from first stage 502 divided by the gain of preamp2 539. This operation is similar to the operations described earlier for the circuit of FIG. 4. Again, care must be taken to match the transfer functions of the two preamps, i.e., preamp1 535 and preamp2 539, respectively, for second stage 504 to accurately evaluate the residue.

The accuracy requirements for low resolution ADCs, e.g., 6-bits, are easily met by the above described topology. However, in higher resolution ADCs, e.g., 12-bits and higher, the offset match requirement becomes more stringent, rendering it hard to meet the desired accuracy. The above is because linearity errors are introduced when offset errors resulting from preamp mismatch push the residue outside the range of the second stage.

However, the above identified problem can be overcome by the addition of an extra redundant bit test in the second stage. This extra bit test is commonly referred to as digital error correction. Digital error correction is described in "A 12-bit Successive-Approximation-Type ADC with Digital Error Correction," Kanti Bacrania, IEEE Journal of Solid-State Circuits, Vol. SC-21, No. 6, pp. 1016–1024, December 1986, that is hereby incorporated by reference in its entirety. The extra bit has the effect of extending the input range of the second stage beyond what is required without the offset errors. By providing the extra bit, the residue remains within the extended input range even if there are offset errors.

FIG. 6 is a simplified schematic diagram of another embodiment of a differential six-bit pipelined successive approximation ADC in accordance with this invention. The description of the functions of the circuit of FIG. 6 that are similar to that of the circuit of FIG. 5 have not been repeated under the description of FIG. 6. Therefore, the detailed structure and operating principles of FIG. 6 are only examined in the aspects which are required to describe distinguishing characteristics of the circuit of FIG. 6 over the circuit of FIG. 5.

As described before, in differential pipelined SAR ADCs, transfer functions associated with the two preamps must match to an accuracy required by the second stage. For example, in the 6-bit ADC described before, the preamps must match to a 3 bit accuracy, or one part in eight. This requirement may be hard to achieve for higher resolution second stages, e.g., 8 bits or more.

FIG. 6 provides another manner of capturing the residue from the top plate of the first CDAC. Unlike the ADC of FIG. 6, ADC 600 provides one preamp 635 which is switched between first and second stage 602 and 604, respectively. Preamp 635 provides buffering of the top plates of capacitor array of first stage 602 comprising capacitors 606–620 from residue sampling switch 639.

The above is accomplished by switching the inputs of preamp 635 between first stage 602 and second stage 604. Thus, during the first time period T0, preamp 635 would be coupled to capacitor array comprising capacitors 622–629, and the output would be used for evaluating bits corresponding to second stage 604. During the last time period T3, however, the inputs of preamp 635 would be switched to capacitor array comprising capacitors 606–620, and the output would be used to drive sample and hold capacitors 633–634 to store the residue. After the last time period T3 is over, the inputs of preamp 635 would switch back to capacitor array comprising capacitors 622–629 to evaluate the residue.

In order to compensate for the absence of buffers in the above described circuit, which may lead to charge stored on the inputs of preamp 635 from the previous conversion disrupting the new CDAC voltage about to be captured when the preamp is switched onto the first CDAC, the inputs of preamp 635 are shorted together before connecting preamp 635 to the first CDAC. The inputs of preamp 635 are also shorted before coupling preamp 635 to second stage 604. Shorting together the inputs of preamp 635 zeroes out any memory of a previous conversion.

The shorting of the inputs of preamp 635 described above is accomplished by switch P3. As mentioned above, the operation of the circuit of FIG. 6 is, for the most part, identical to that of the circuit of FIG. 5, up until just before the last time-cycle, i.e., end of T2. P2 goes low at the end of second time period T2, disconnecting preamp 635 from second stage 604. Subsequent to P2 going low, P3 goes high and shorts the inputs of preamp 635 together. P3 remains high for a long enough time to completely discharge the input capacitance, e.g., 1–3 ns. Thereafter, P3 goes low, thereby opening up inputs of preamp 635. After P3 goes low, P1 couples to first stage 602, following which T3 rises and the last time cycle tests the final bit of first stage 602 while the residue is being stored in sample and hold circuit 638 at the output of preamp1 635.

Whereas the principles of this invention have been illustrated in the context of a two-stage pipelined successive approximation ADC, it will be understood that a pipelined successive approximation having more than two stages can be constructed in accordance with the principles of this inventions.

Although preferred embodiments of the inventions have been disclosed, with various components connected to other components, persons skilled in the art will appreciate that it may not be necessary for such connections to be direct and additional components may be interconnected between the shown components without departing from the spirit of the invention as shown. One skilled in the art will appreciate that the present invention can be practiced by other than the described embodiments, which are presented for purposes of illustration and not of limitation, and the present invention is limited only by the claims which follow.

What is claimed is:

1. A pipelined analog to digital converter (ADC) circuit for converting an analog input signal to a digital output signal having most significant bits (MSBs) and least significant bits (LSBs), said ADC circuit comprising:

a first stage coupled to receive said analog input signal comprising:
a first CDAC and associated control that convert a portion of said analog input signal corresponding to said (MSBs) from analog to digital; and
a first buffer with associated transfer function coupled to said first CDAC for outputting a first stage residue signal corresponding to said LSBs; and a second stage coupled to said first stage to receive said first stage residue signal comprising:
a second CDAC and associated control that convert said first stage residue signal to said LSBs; and
a second buffer with associated transfer function coupled to said second CDAC, wherein said second buffer has matched transfer function as said first buffer.

2. The ADC circuit of claim 1, wherein said first buffer and said second buffer are substantially matched.

3. The ADC circuit of claim 1, wherein said first stage further comprises:
a first successive approximation register coupled to provide an input to said first CDAC; and
a first comparator coupled to an output of said first CDAC and to an input of said first successive approximation register.

4. The ADC circuit of claim 3, wherein said second stage further comprises:
a second successive approximation register coupled to provide an input to said second CDAC; and
a second comparator coupled to an output of said second CDAC and to an input of said second successive approximation register.

5. The ADC circuit of claim 4, wherein said second buffer circuit is coupled between said second CDAC and said second comparator.

6. The ADC circuit of claim 5 further comprising a residue sample and hold circuit coupled between said first buffer circuit and said second comparator.

7. The ADC circuit of claim 3, wherein said first buffer circuit isolates said first stage CDAC from loading effects of said first comparator and said second buffer circuit isolates said second stage CDAC from loading effects of said second comparator.

8. The ADC circuit of claim 1, wherein said first and second buffer circuits each comprise source-follower transistors.

9. The ADC circuit of claim 1, wherein said first and second buffer circuits are preamplifier circuits.

10. The ADC circuit of claim 9, wherein said first and second buffer preamp circuits provide gain to said MSBs and said LSBs, respectively.

11. The ADC circuit of claim 10, wherein said first and second buffer preamp circuits are substantially matched.

12. A pipelined analog to digital converter (ADC) circuit for converting an analog input signal to a digital output signal having most significant bits (MSBs) and least significant bits (LSBs), said ADC circuit comprising:

a first stage coupled to receive said analog input signal including a first CDAC and associated control that convert a portion of said analog input signal corresponding to said MSBs from analog to digital, said first stage providing a residue signal corresponding to said LSBs;

a second stage coupled to said first stage to receive said residue signal, said second stage including a second CDAC matched to said first CDAC and associated control that convert said residue signal to said LSBs while said first stage may be processing another analog signal and a sampling circuit that samples said residue signal; and a buffer circuit coupled to said first CDAC, said second CDAC and said sampling circuit such that said buffer circuit is switched to provide signals between one of said first and second CDACs and said sampling circuit.

13. The ADC circuit of claim 12, wherein said buffer circuit comprises source-follower transistors.

14. The ADC circuit of claim 12, wherein said buffer circuit comprises a preamplifier circuit.

15. The ADC circuit of claim 12, wherein inputs to said buffering circuit are reset prior to said buffering circuit receiving each input signal.

16. The ADC circuit of claim 12, wherein said sampling circuit comprises a sample and hold circuit that operates to sample and hold said residue signal.

* * * * *

UNITED STATES PATENT AND TRADEMARK OFFICE
CERTIFICATE OF CORRECTION

PATENT NO. : 6,124,818
DATED : September 26, 2000
INVENTOR(S) : David M. Thomas et al.

It is certified that error appears in the above-identified patent and that said Letters Patent is hereby corrected as shown below:

Item [56] OTHER PUBLICATION
In "T. Cho, P. Gary" change "20Msamples/s," to -- 20Msample/s, --.

Item [57] ABSTRACT,
Change "comprises" to -- comprise --.

Column 5,
Line 35, delete "of".
Line 43, delete "of".

Column 6,
Line 67, change "reduces" to -- reduce --.

Figure 5B:
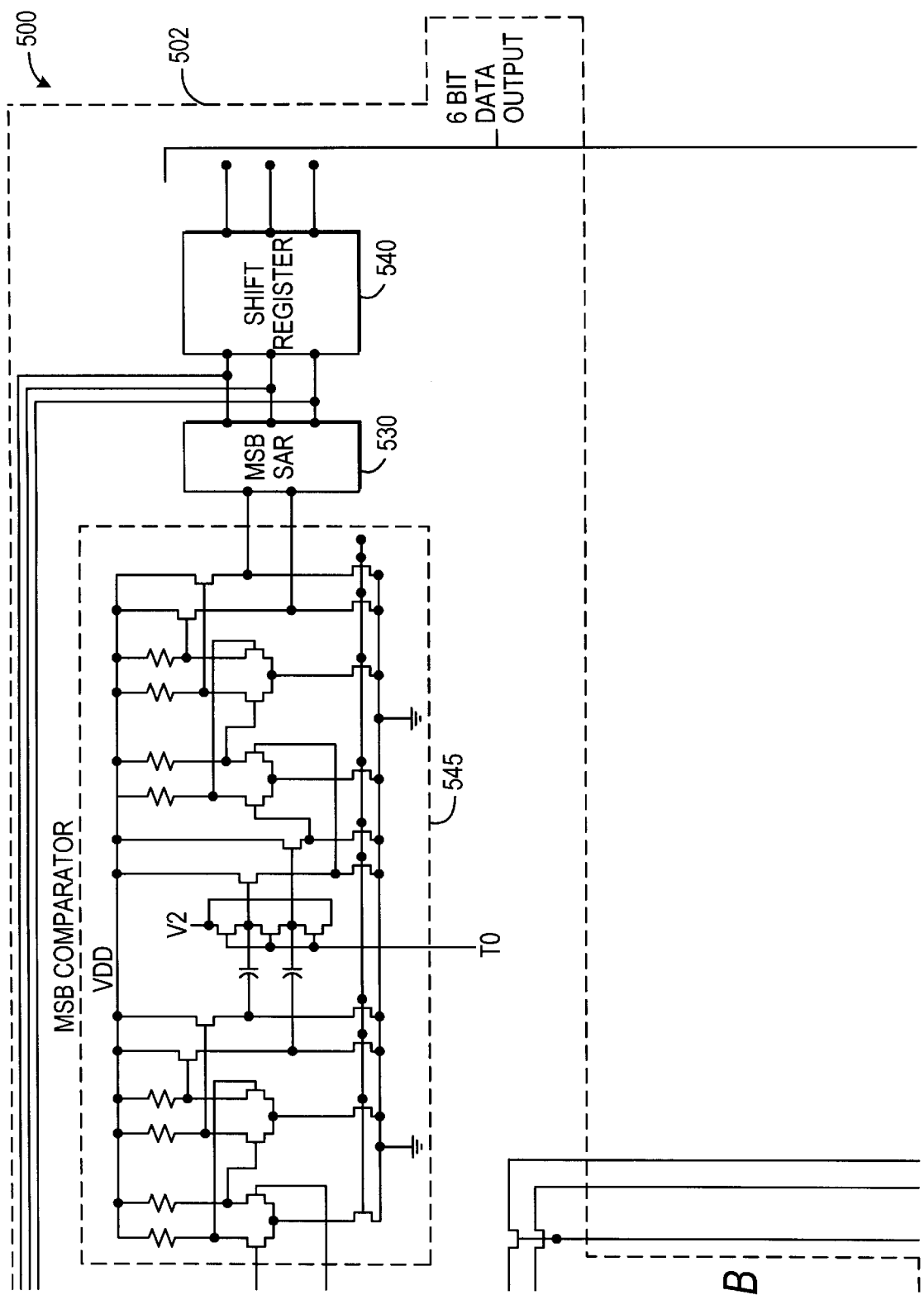
Figure 5C:
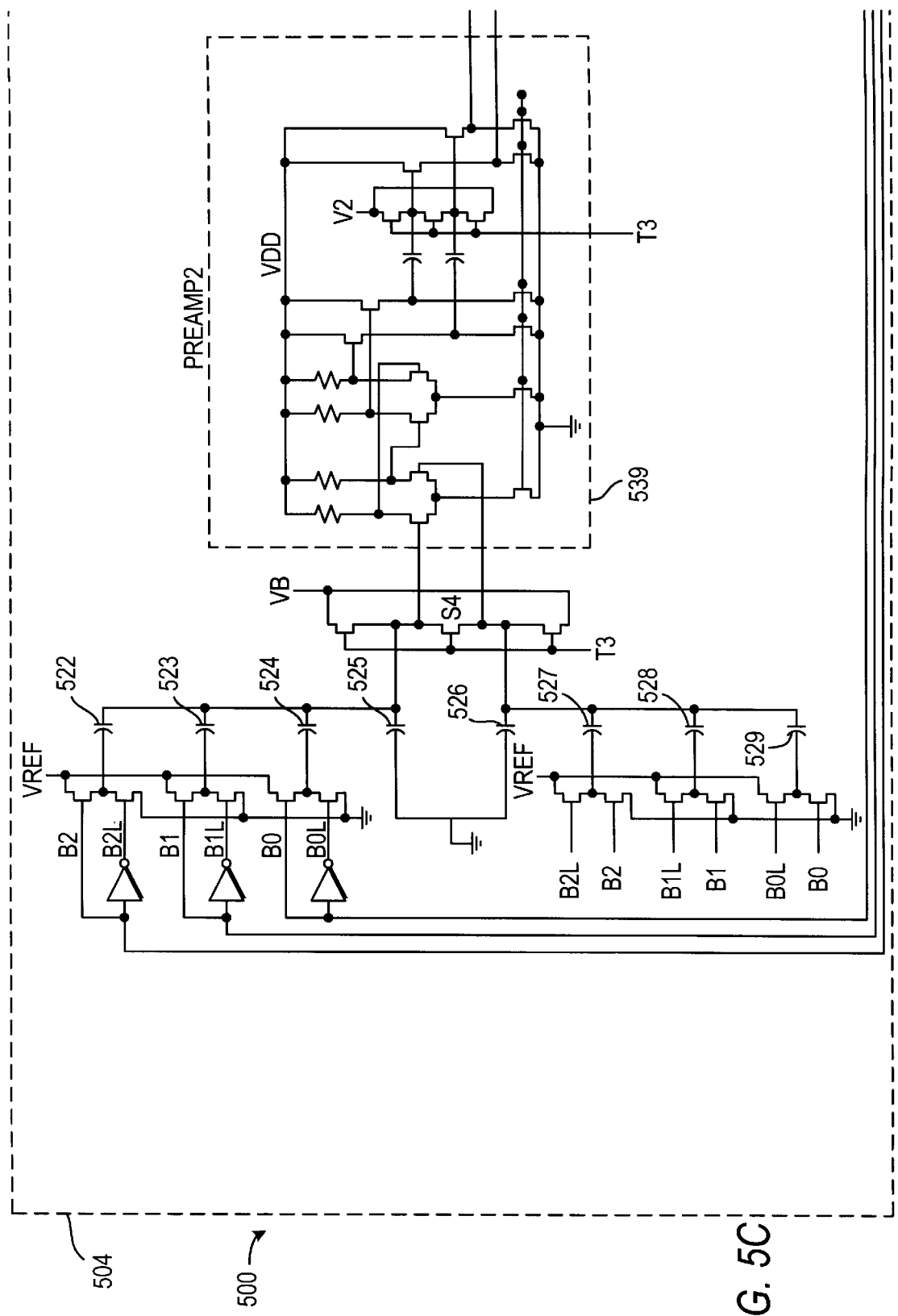
Figure 5D:
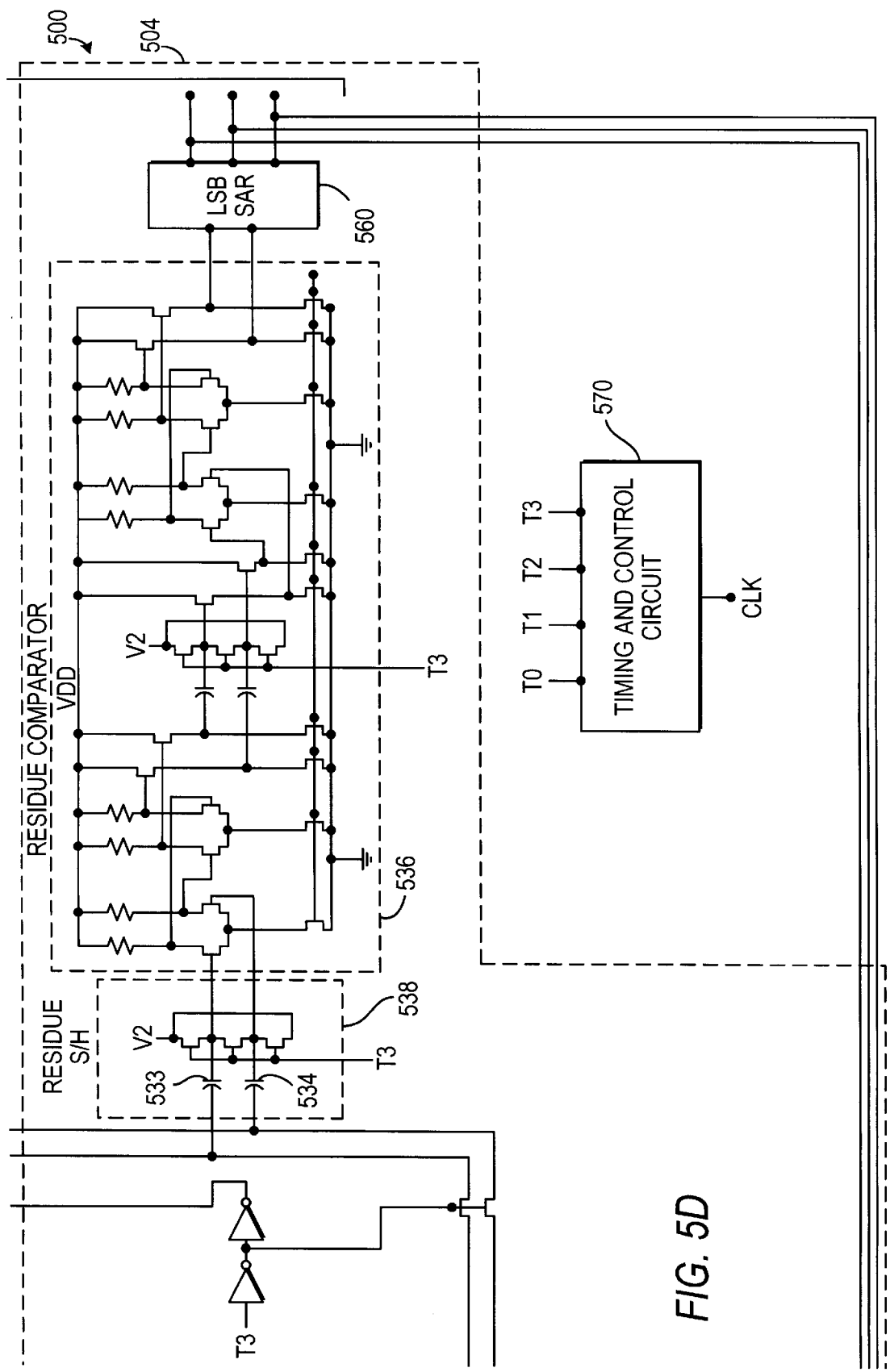

Column 8,
Line 24, change "FIG. 5 is a" to -- FIGS. 5A-5D, collectively referred to as FIG. 5, are --; and change "diagram" to -- diagrams --.

Figure 6B:
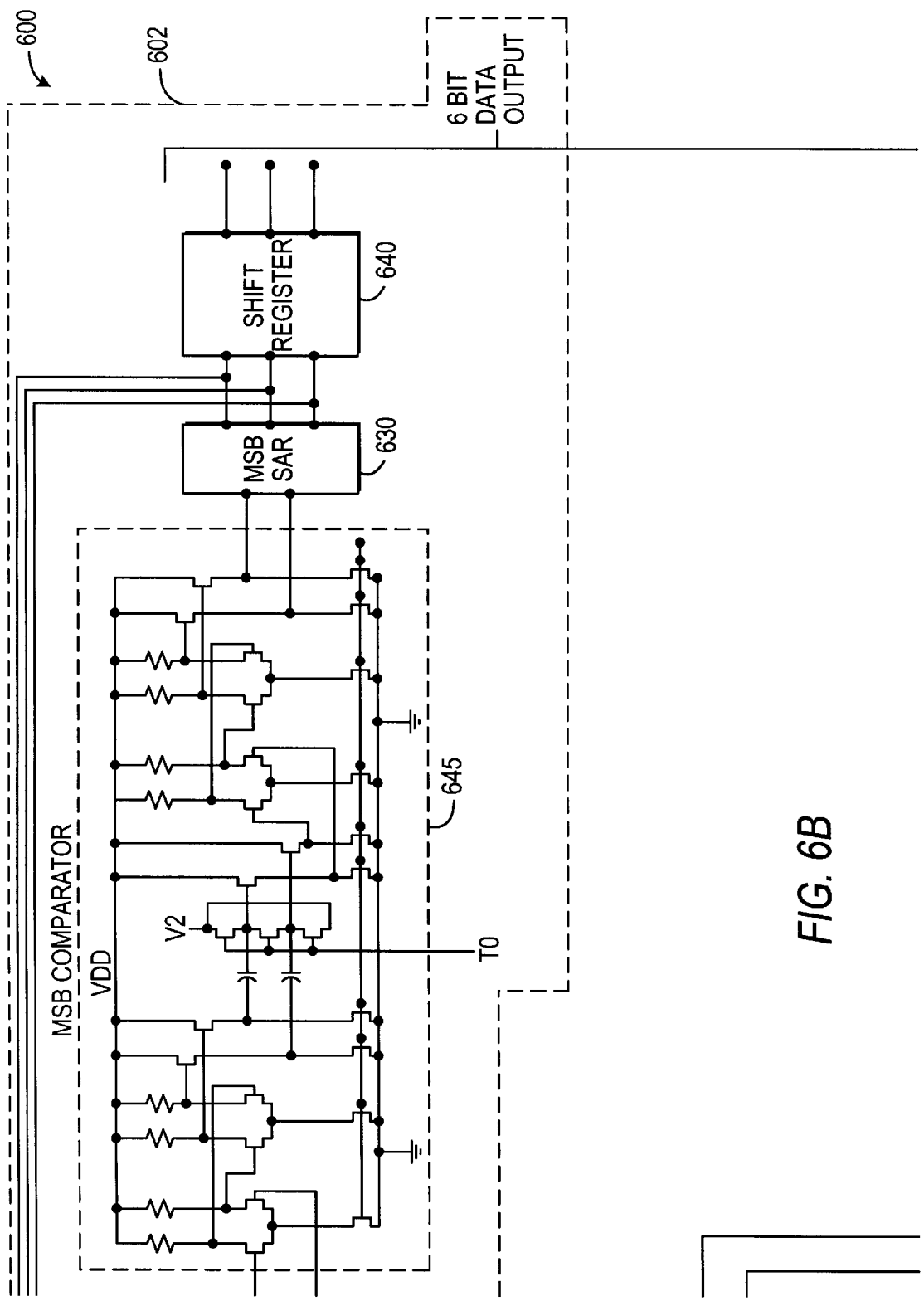
Figure 6C:
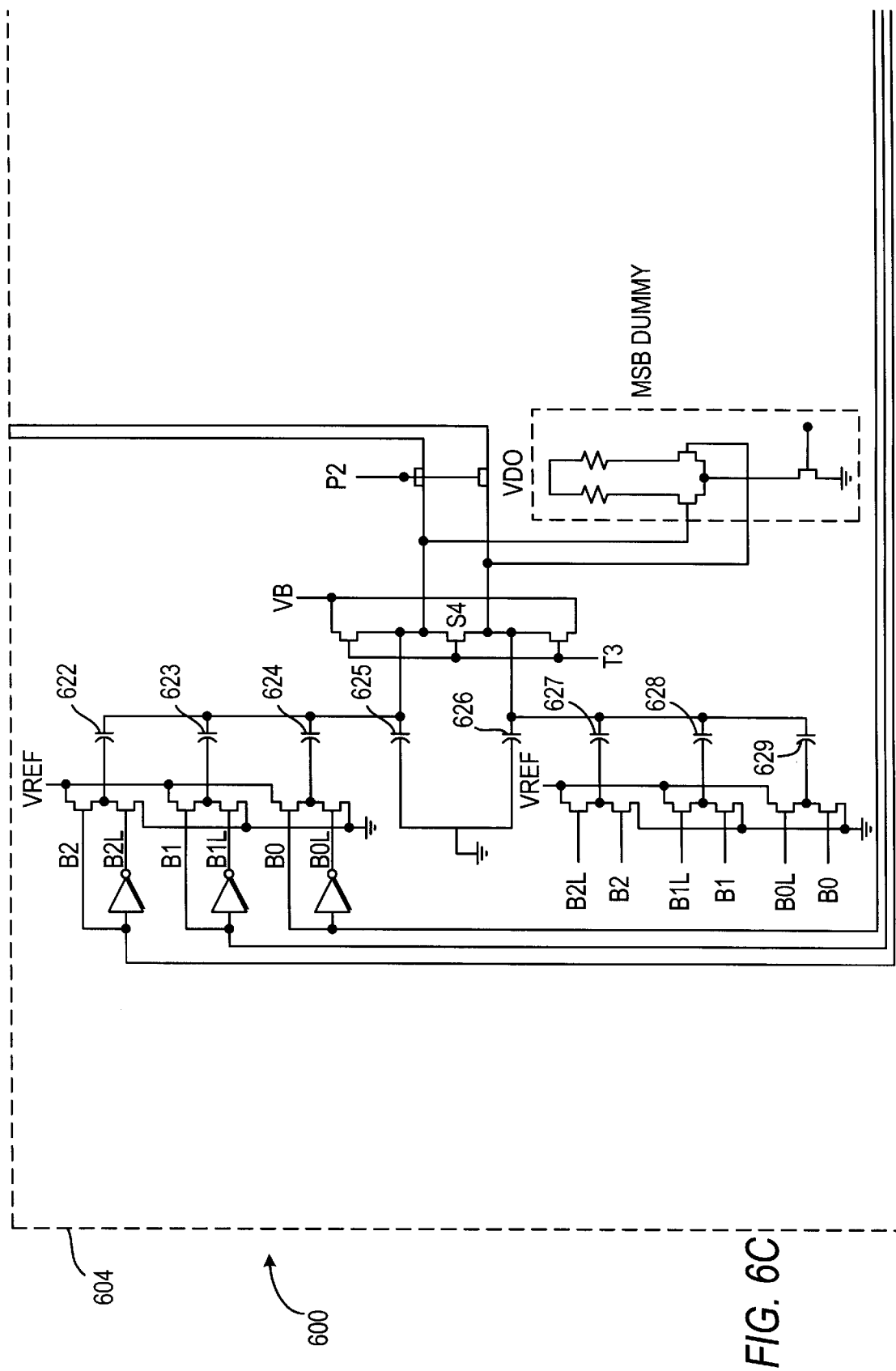
Figure 6D:
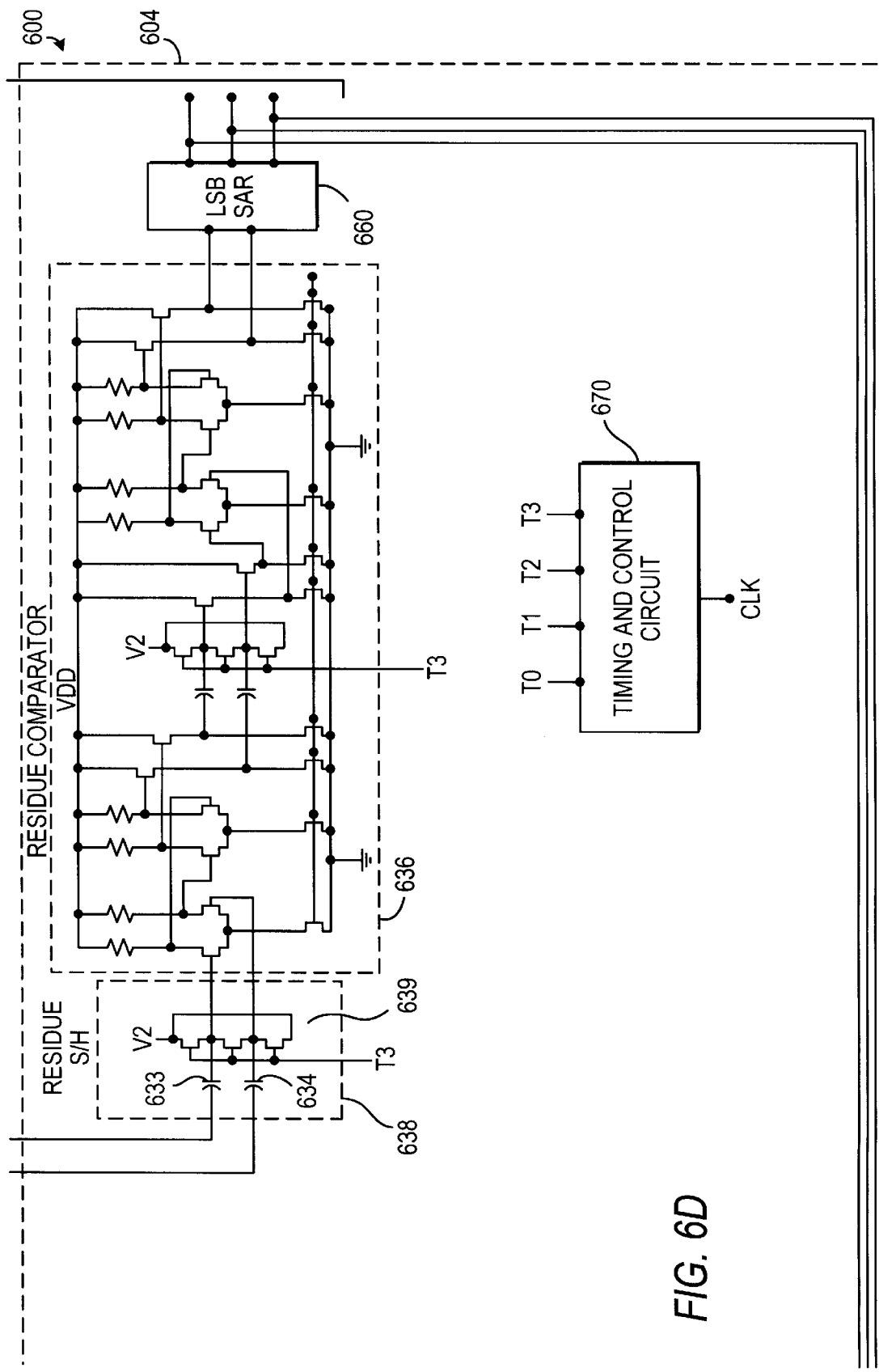

Column 9,
Line 55, change "FIG. 6 is a" to -- FIGS. 6A-6D, collectively referred to as FIG. 6, are --; and change "diagram" to -- diagrams --.

Column 10,
Line 56, change "inventions" to -- invention --.
Line 57, change "inventions" to -- invention --.

Signed and Sealed this

First Day of January, 2002

*Attest:*

JAMES E. ROGAN
*Director of the United States Patent and Trademark Office*

*Attesting Officer*